United States Patent
Douzaka et al.

(10) Patent No.: US 7,867,671 B2
(45) Date of Patent: Jan. 11, 2011

(54) PHOTO-MASK HAVING PHASE AND NON-PHASE SHIFTER PARTS FOR PATTERNING AN INSULATED GATE TRANSISTOR

(75) Inventors: Toshiaki Douzaka, Kanagawa-ken (JP); Kyosuke Ogawa, Kanagawa-ken (JP); Kaoru Hama, Kanagawa-ken (JP); Hiroaki Suzuki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 532 days.

(21) Appl. No.: 11/862,701

(22) Filed: Sep. 27, 2007

(65) Prior Publication Data

US 2008/0107974 A1 May 8, 2008

(30) Foreign Application Priority Data

Sep. 27, 2006 (JP) ............................. 2006-263307

(51) Int. Cl.
*G03F 1/08* (2006.01)
*G03F 1/14* (2006.01)
(52) U.S. Cl. ......................................................... 430/5
(58) Field of Classification Search ...................... 430/5
See application file for complete search history.

(56) References Cited

U.S. PATENT DOCUMENTS

| 6,582,858 B2 * | 6/2003 | Lai et al. .................... 430/5 |
| 6,841,318 B2 | 1/2005 | Iwasaki |
| 2003/0096177 A1 * | 5/2003 | Iwasaki ........................ 430/5 |
| 2004/0219439 A1 * | 11/2004 | Asano et al. .................. 430/5 |
| 2006/0186409 A1 * | 8/2006 | Horino et al. ................ 257/59 |

FOREIGN PATENT DOCUMENTS

JP     2003-149787     5/2003

* cited by examiner

*Primary Examiner*—Mark F Hull
*Assistant Examiner*—John Ruggles
(74) *Attorney, Agent, or Firm*—Finnegan, Henderson, Farabow, Garrett & Dunner, L.L.P.

(57) ABSTRACT

A photo-mask that includes a first light shielding region which is narrow and elongated, and a second light shielding region which is wider and more elongated than the first light shielding region and is away from the first light shielding region. A phase shifter part and a non-phase shifter part are provided adjacently to both sides of the first light shielding region. Two phase shifter parts or two non-phase shifter parts are respectively provided adjacently to both sides of the second light shielding part.

4 Claims, 17 Drawing Sheets

PHOTO-MASK HAVING PHASE AND NON-PHASE SHIFTER PARTS FOR PATTERNING AN INSULATED GATE TRANSISTOR

CROSS REFERENCE TO RELATED APPLICATION

This application is based upon and claims the benefit of priority from the prior Japanese Patent Application No. 2006-263307, filed on Sep. 27, 2006, the entire contents of which are incorporated herein by reference.

FIELD OF THE INVENTION

The present invention relates to a photo-mask, a multiphase exposure method, and a method of manufacturing a semiconductor device including insulating gate-type transistors, which are respectively used for a micro-scale process in such a technical field as semiconductor.

DESCRIPTION OF THE BACKGROUND

Recent years, phase-shifting masks have been often used for processing LSI (Large Scale Integrated) circuits in a nano-scale or a micro-scale, with advance of miniaturization, lower voltage and larger scale of the LSI circuits.

In logic LSI circuits or system LSI circuits, a mixed pattern is employed for a gate pattern, for example, which includes dense pitches and sparse pitches. Multiphase exposure methods utilizing a plurality of photo-masks are used for exposing such a mixed pattern with dense pitches and sparse pitches.

A multiphase exposure method is disclosed in Japanese Patent Application Publication (Kokai) No. 2003-149787. In the method, an exposure pattern is created on a resist layer by use of a Levenson type phase-shifting mask. After the exposure using the Levenson type phase-shifting mask, an exposure is carried out to remove unnecessary portions from the resist layer by use of a trimming mask which is a regular mask but not a phase-shifting mask. After the exposure using the trimming mask, a development process is carried out so that micro-scale resist patterns are formed.

The logic LSI circuits and system LSI circuits mentioned above need to be designed in consideration of driving capability, power consumption or leakage current of the transistors constituting the logic LSI circuits and system LSI circuits. In order to meet such a requirement, micro-scale patterns which are different from one another in dimensional width need to be formed depending on the characteristics of the transistor.

In the photo-mask disclosed in the patent publication, non-phase shifter parts, narrow and elongated light shielding patterns and phase shifter parts are formed in an alternating series arrangement. However, the patent publication does not describe any configuration to prevent increase in area of layouts of the LSI circuits, in a case where micro-scale patterns with different dimensional width are created in the same phase-shifting mask.

SUMMARY OF THE INVENTION

According to an aspect of the invention, a photo-mask is provided, which includes a first light shielding region being narrow and elongated, a second light shielding region being wider than the first light shielding region and being away from the first light shielding region, a first light transmitting region being arranged on a first side of the first light shielding region and being provided with a first one of a phase shifter part and a non-phase shifter part, a second light transmitting region being arranged between a second side of the first light shielding region and a first side of the second light shielding region, the second light transmitting region being provided with a second one of a phase shifter part and a non-phase shifter part, and a third light transmitting region being arranged on a second side of the second light shielding region and being provided with a first one of a phase shifter part and a non-phase shifter part.

According to another aspect of the invention, a multiphase exposure method is provided, which comprises exposing a resist selectively by use of a first photo-mask using phase shift and exposing the resist selectively by use of a second photo-mask, the first photo-mask including a first light shielding region being narrow and elongated, a second light shielding region being wider than the first light shielding region and being away from the first light shielding region, a first light transmitting region being arranged on a first side of the first light shielding region and being provided with a first one of a phase shifter part and a non-phase shifter part, a second light transmitting region being arranged between a second side of the first light shielding region and a first side of the second light shielding region, the second light transmitting region being provided with a second one of a phase shifter part and a non-phase shifter part, and a third light transmitting region being arranged at a second side of the second light shielding region and being provided with a first one of a phase shifter part and a non-phase shifter part.

According to yet another aspect of the invention, a method of manufacturing a semiconductor device including insulated-gate type transistors is provided, which comprises forming a resist on a substrate to be processed, exposing a transistor area of the resist by use of a first photo-mask using phase shift selectively; exposing an interconnection area of the resist by use of a second photo-mask selectively, forming gate patterns and interconnection patterns by development, and processing the substrate to be processed by use of the gate patterns and the interconnection patterns, wherein the first photo-mask includes a first light shielding region being narrow and elongated for forming some of the gate patterns, a second light shielding region for forming others of the gate patterns, the second light shielding region being wider than the first light shielding region and being away from the first light shielding region; a first light transmitting region being arranged on a first side of the first light shielding region and being provided with a first one of a phase shifter part and a non-phase shifter part, a second light transmitting region being arranged between a second side of the first light shielding region and a first side of the second light shielding region and being provided with a second one of a phase shifter part and a non-phase shifter part, and a third light transmitting region being arranged on a second side of the second light shielding region and being provided with a first one of a phase shifter part and a non-phase shifter part.

DETAILED DESCRIPTION OF THE INVENTION

Embodiments of the invention will be explained hereinafter with reference to the drawings.

Figure 1:
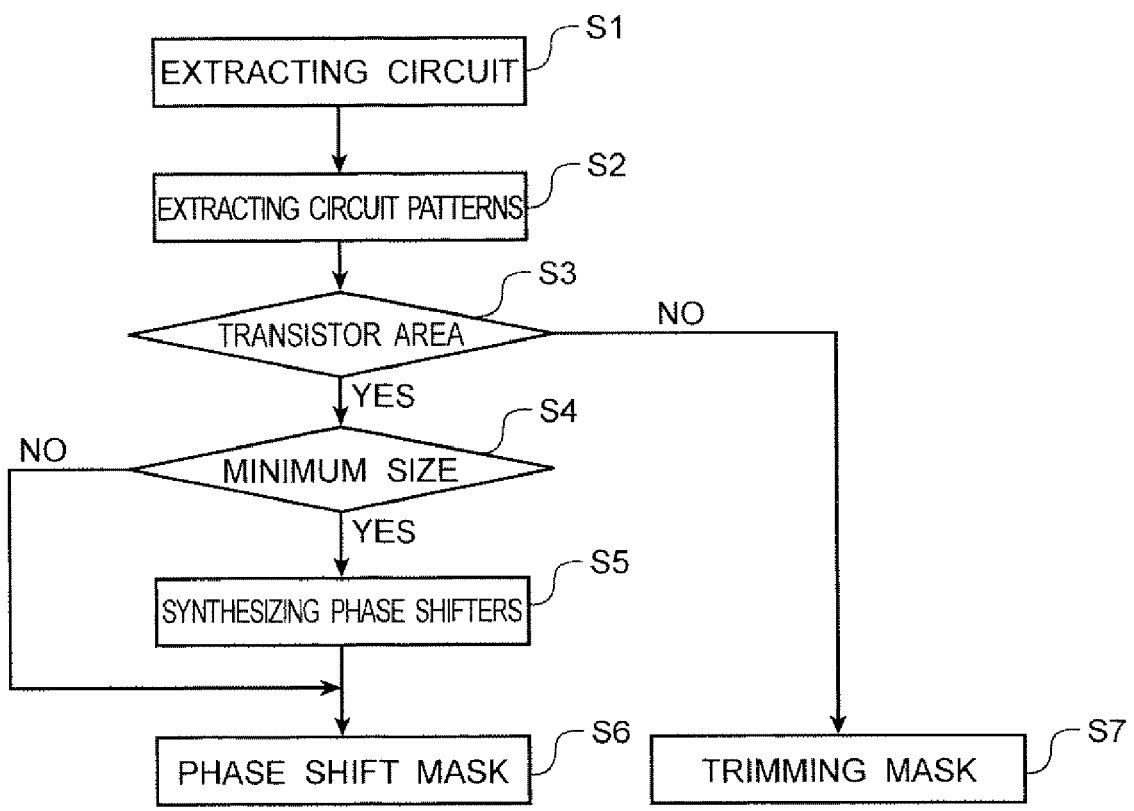
FIG. 1 is a flowchart showing an example of a method of designing a phase-shifting mask and a trimming mask.
Figure 2:
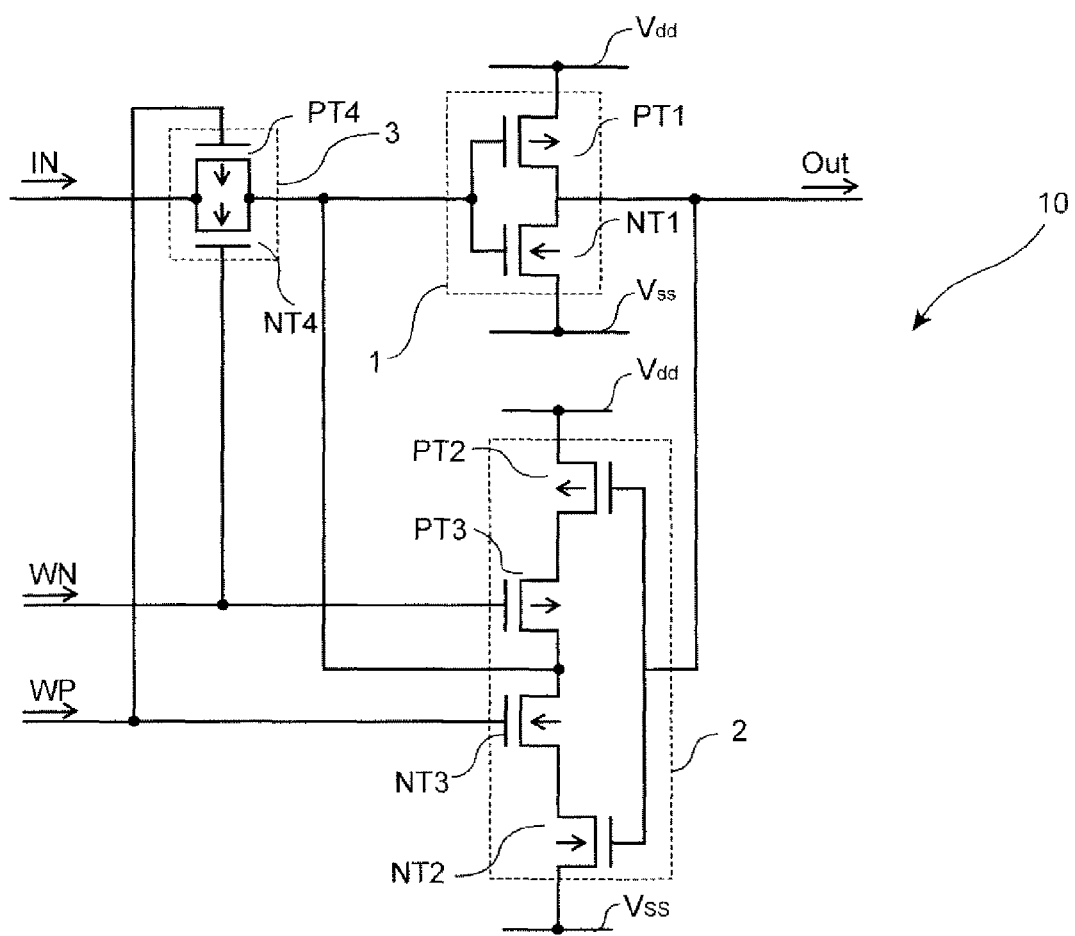
FIG. 2 is a circuit diagram showing an example of a latch feedback circuit.
Figure 3:
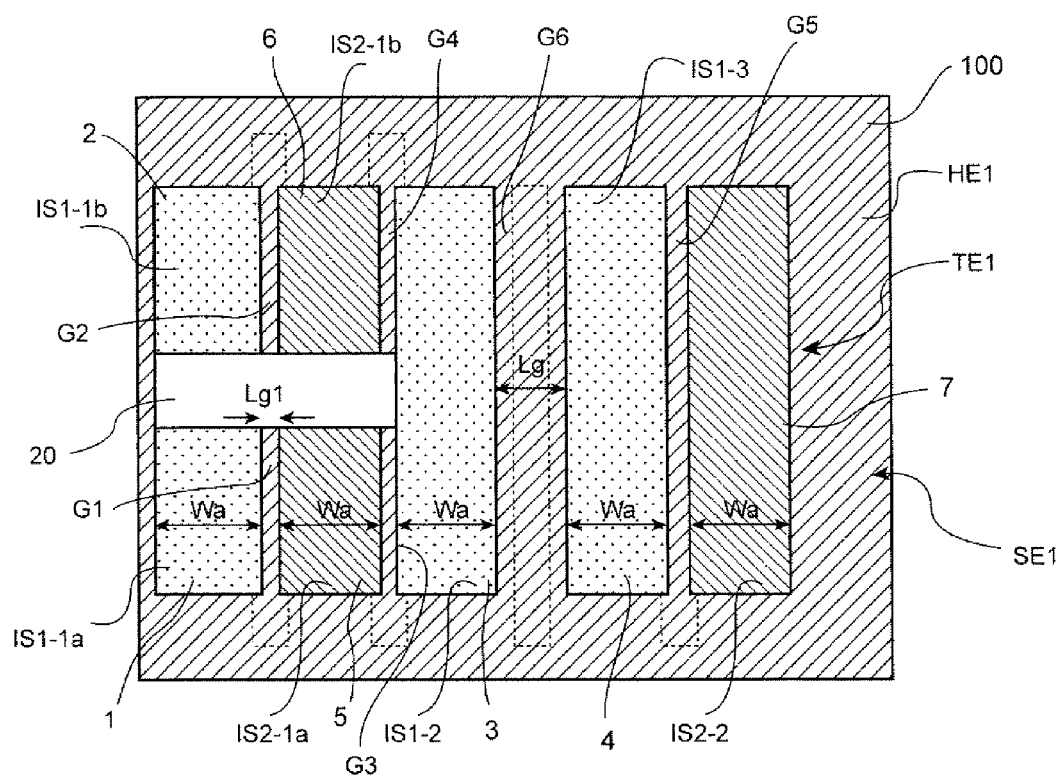
FIG. 3 is a plan view showing a first embodiment of a phase-shifting mask according to the invention.
Figure 4:
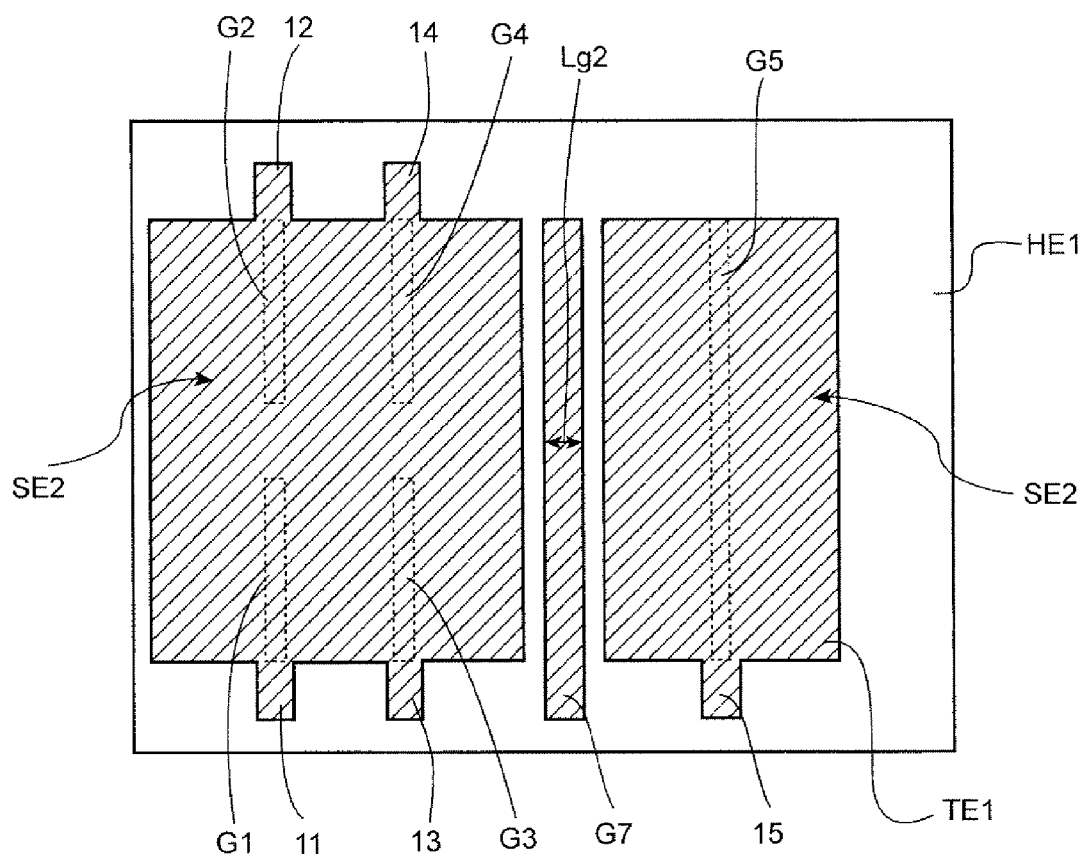
FIG. 4 is a plan view showing a trimming mask to be used for a first embodiment of a multiphase exposure method according to the invention.
Figure 5:
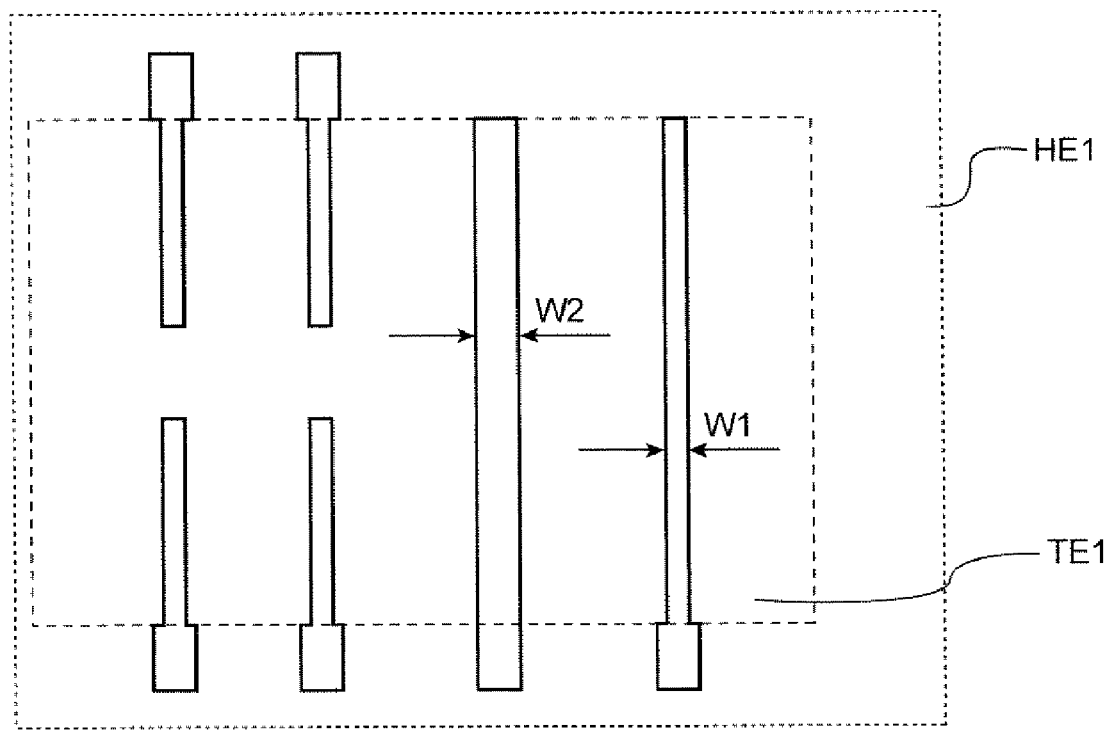
FIG. 5 is a plan view showing photo-resist patterns to be formed by use of the first embodiment of the multiphase exposure method according to the invention.

First embodiments respectively of a photo-mask, a multiphase exposure method and a method of manufacturing a semiconductor device including insulating gate-type transistors will be explained. FIG. 1 is a flowchart showing an example of a method of designing a phase-shifting mask and a trimming mask. FIG. 2 is a circuit diagram showing an example of a latch feedback circuit. FIG. 3 is a plan view showing a first embodiment of a phase-shifting mask according to the invention, which is applied to the latch feedback circuit. FIG. 4 is a plan view showing a trimming mask to be used for the first embodiment of a multiphase exposure method according to the invention. FIG. 5 is a plan view showing photo-resist patterns to be formed by use of the first embodiment of the multiphase exposure method according to the invention.

The first embodiment of the multiphase exposure method according to the invention adopts a double-phase exposure method using a Levenson type phase-shifting mask as a first photo-mask, and a trimming mask as a second photo-mask. The "trimming mask" means a regular mask which does not include a phase shifter parts.

In the process of designing the phase-shifting mask and the trimming mask, as shown in FIG. 1, a check is made on whether or not there is a circuit constituting a system LSI circuit which includes transistors different from one another in driving capability, in power consumption, or in leakage current. As a result, a circuit including such transistors is extracted. In the embodiment, it is assumed that a latch feedback circuit 10 including transistors different from one another in driving capability as shown in FIG. 2 is extracted (step S1).

The latch feedback circuit 10 shown in FIG. 2 includes an inverter 1, a clocked inverter 2 and a transfer gate 3. The inverter 1 and the clocked inverter 2 constitute a latch circuit. The latch feedback circuit 10 latches an input signal IN as a data signal on the basis of a clock signal WN and a clock signal WP. The latch feedback circuit 10 outputs a resultantly obtained output signal OUT to a memory circuit which is not illustrated here.

The transfer gate 3 includes a p-channel MOS transistor PT4 and an n-channel MOS transistor NT4. The gate of the p-channel MOS transistor PT4 receives the clock signal WP. The gate of the n-channel MOS transistor NT4 receives the clock signals WN. The transfer gate 3 operates to outputs the input signal IN to the inverter 1, when the clock signal WP is at a "Low" level and the clock signal WN is at a "High" level.

The inverter 1 includes a p-channel MOS transistor PT1 and an n-channel MOS transistor NT1 which are serially connected to each other. The p-channel MOS transistor PT1 is connected to a high potential voltage supply Vdd. The n-channel MOS transistor NT1 is connected to a low potential voltage supply Vss. The input signal IN is inputted to the input side of the inverter 1 via the transfer gate 3. The inverter 1 outputs a signal OUT which results from inversion of the input signal IN. The output signal OUT is supplied to the input side of the clocked inverter 2.

The clocked inverter 2 includes a p-channel MOS transistor PT2, a p-channel MOS transistor PT3, an n-channel MOS transistor NT3 and an n-channel MOS transistor NT2 which are serially connected to one another. The p-channel MOS transistor PT2 is connected to the high potential voltage supply Vdd. The n-channel MOS transistor NT2 is connected to the low potential voltage supply Vss. The clocked inverter 2 inputs the signal OUT, to the gates of the p-channel MOS transistor PT3 and the n-channel MOS transistor NT2 respectively. The clock signal WN is inputted to the gate of the p-channel MOS transistor PT3 while the clock signal WP is inputted to the gate of the n-channel MOS transistor NT3. The clocked inverter 2 inverts the signal OUT supplied from the inverter 1, and inputs the resultantly inverted signal as an output signal to the input side of the inverter 1 by feeding back.

The p-channel MOS transistors PT1, PT3 and PT4 and the n-channel MOS transistors NT1, NT3 and NT4 are required to have a higher driving capability. The driving capability is termed as a "driving power" as well. On the other hand, the p-channel MOS transistor PT2 and the n-channel MOS transistor NT2 are not necessarily required to have a higher driving capability.

After the step S1, as shown in FIG. 1, circuit patterns are extracted from the latch feedback circuit 10 (step S2). In this case, it is assumed that the gate patterns of the respective transistors shown in FIG. 2 are extracted. The p-channel MOS transistors PT1, PT3 and PT4 and the n-channel MOS transistors NT1, NT3 and NT4 are set to have a minimum dimensional width. It is because these transistors are required to have the higher driving capability. On the other hand, the p-channel MOS transistor PT2 and the n-channel MOS transistor NT2 are set to have a fine dimensional width which is wider than the minimum dimensional width. It is because these transistors are not necessarily required to have the higher driving capability.

Subsequently, the latch feedback circuit 10 is divided into a transistor area and an interconnection area (step S3). In the transistor area, the gates, sources and drains of the transistors are arranged, while in the interconnection area, interconnections such as gate lead-out lines are arranged. The reason, why the latch feedback circuit 10 is divided into the transistor area and the interconnection area, is that wider patterns are arranged in the interconnection area, while patterns of the minimum dimensional width are arranged in the transistor area. As a result, phase shifter parts are arranged in the transistor area.

After the step S3, the transistor area is selected. It is determined whether or not the dimensional width of each of portions of the gate patterns, to be gate electrode parts is the minimum dimensional width in the transistor area (step S4).

In a case that the dimensional width of a light shielding portion for a gate electrode part is the minimum dimensional width, a non-phase shifter part and a phase shifter part are provided on the two sides of the gate pattern opposite to each other respectively. The non-phase shifter part and the phase shifter part are adjacent to the light shielding portion in the direction of the mask surface respectively. Specifically, a phase shifter part, which shifts the phase of a transmitted light by one (a first one) of zero degree and 180 degrees, is provided on one side (a first side) of the gate pattern. On the other hand, the other phase shifter part, which shifts the phase of the transmitted light by the other one (a second one) of zero degree and 180 degrees, is provided on the other side (a second side) opposite to the one side (a first side). Thereby, design data for the one of the two phase shifter parts and design data for the other one of the two phase shifter parts are synthesized (step S5).

In a case that, in step S5, the dimensional width of a light shielding portion for a gate electrode part is not the minimum dimensional width, the gate pattern is arranged adjacently to a phase shifter part or a non-phase shifter part disposed on a side of the gate pattern with the minimum dimensional width, which is close and opposite to the gate pattern being not the minimum dimensional width.

Here, phase shifter parts of the same phase are provided on the two sides of the gate pattern being not the minimum dimensional width respectively. In addition, a light shielding region is provided for the purpose of shielding the trimming mask part using no phase shifter. In this manner, the phase-shifting mask is formed (step S6).

The step S6 will be explained in detail hereinafter.

FIG. 3 shows an embodiment of the photo-mask to be used for manufacturing the latch feedback circuit 10 shown in FIG. 2. A substrate 100 used for the photo-mask shown in FIG. 3 is made of, for example, quartz glass. The portion indicated by diagonal lines running from upper right to lower left in FIG. 3 is a light shielding area SE made of, for example, a chromium film. The transistor area TE1 includes rectangular light shielding regions G1 to G6 for forming the respective gate patterns and rectangular light transmitting regions 1 to 7. The light shielding regions G1 to G3 are formed to have the minimum dimensional width. The light shielding region G6 is formed to have a width slightly wider than the actual width of the corresponding gate pattern, as described later. The width of the gate pattern is wider than the minimum width. The light shielding regions G1 to G6 are parts of the light shielding area SE1. A non-phase shifter part IS1-1a is arranged in the light transmitting region 1. A non-phase shifter part IS1-1b is arranged in the light transmitting region 2. A non-phase shifter part IS1-2 is arranged in the light transmitting region 3. A non-phase shifter part IS1-3 is arranged in the light transmitting region 4. A phase shifter part IS2-1a is arranged in the light transmitting region 5. A phase shifter part IS2-1b is arranged in the light transmitting region 6. A phase shifter part IS2-2 is arranged in the light transmitting region 7. The interconnection area HE1 surrounding the transistor area TE1 is the rest in the light shielding area SE1.

Specifically, the light shielding regions G1, G2 and G5 (each with a gate length Lg1) corresponding to gate patterns with the minimum dimensional width respectively The non-phase shifter part IS1-1a is provided on one side (a first side) of the light shielding regions G1. The non-phase shifter part IS1-1b is provided on one side of the light shielding regions G2. The non-phase shifter part IS1-3 is provided on one side of the light shielding regions G5. The phase shifter part IS2-1a is provided on the other side (a second side) of the light shielding regions G1. The phase shifter part IS2-1b is provided on the other side of the light shielding regions G2. The phase shifter part IS2-2 is provided on the other side of the light shielding regions G5. Each of the non-phase shifter parts IS1-1a, IS1-1b and IS1-3 shifts the phase of its transmitted light by zero degree. Each of the phase shifter parts IS2-1a, IS2-1b and IS2-2 shifts the phase of its transmitted light by 180 degrees. The non-phase shifter part IS1-2, which exists between the light shielding region G6 and the light shielding regions G3 and G4, shifts the phase of a transmitted light by zero degree. The zero-degree phase shifter parts may have any configuration as long as the configuration allows a transmitted light to pass through the phase shifter part without shifting the phase of the transmitted light as it is. The non-phase shifter part IS1-1a and the phase shifter part IS2-1a are respectively arranged opposite to the non-phase shifter part IS1-1b and the phase-shifter part IS2-1b via a light transmitting region 20. The light transmitting region 20 is not provided with a phase shifter part.

The no-phase shifter parts IS1-1a, IS1-1b, IS1-2 and IS1-3 and the phase shifter parts IS2-1a, IS2-1b and IS2-2 are formed to have the same width Wa. The periphery of each of the no-phase shifter parts IS1-1a, IS1-1b, IS1-2 and IS1-3 and the phase shifter parts IS2-1a, IS2-1b and IS2-2 is contiguous with the light shielding area SE1. The width Lg of the light shielding region G6 is slightly wider than the width of the gate patterns respectively for forming the p-channel MOS transistor PT2 and the n-channel MOS transistor NT2. The gate patterns of the p-channel MOS transistor PT2 and the n-channel MOS transistor NT2 have a fine dimensional width wider than the minimum dimensional width. The non-phase shifter part IS1-2 is provided on one side of the light shielding region G6. The phase shifter part IS1-3 is provided on the other side of the light shielding region G6, which is opposite to the one side of the light shielding region G6.

The light shielding regions G1 and G3 and the light shielding regions G2 and G4 each with the minimum dimensional width are arranged with uniform pitches. However, the light shielding region G6 is arranged in the transistor area as well. The light shielding region G6 has a fine dimensional width wider than the minimum dimensional width. As a result, the gate patterns are not necessarily arranged with the same pitches. Both light shielding regions with dense pitches and light shielding regions with sparse pitches are present in the transistor area at the same time.

Subsequently, if the interconnection area HE1 is selected in FIG. 1, the gate patterns of the interconnection area HE1 are recognized so that the light shielding areas for shielding the transistor areas are provided. The trimming mask as a second photo-mask is formed by the arrangement (step S7).

FIG. 4 shows the trimming mask specifically. A light shielding area SE2 shields the transistor area TE1 from light. This transistor area TE1 includes the light shielding regions G1 to G5 for forming the respective gate patterns of the minimum dimensional width, the non-phase shifter parts IS1-1a, IS1-1b, IS1-2 and IS1-3, the phase shifter parts IS2-1a, IS2-1b and IS2-2 and the region 20. The parts to be formed as the p-channel MOS transistor PT2 and the n-channel MOS transistor NT2 are shielded from light by a narrow and elongated rectangular light shielding region G7. The parts have the fine dimensional width wider than the minimum dimensional width. Interconnection portions respectively of the gate layers are shielded from light by light non-shielding areas 11 to 15 (step S7). The gate length Lg2 of the gate to be formed by use of the light shielding region G7 as a gate pattern is shorter than the gate length Lg.

The resist patterns are dually exposed to light by use of the phase-shifting mask and the trimming mask as described above. After the exposure, the resist is developed. The resultant resist pattern has a shape as shown in FIG. 5. A resist pattern corresponding to the gate electrode of the minimum width is formed in the transistor area TE1 to have a predetermined width W1. A resist pattern is formed in the transistor area TE1 corresponding to the gate electrode of the fine dimensional width wider than the minimum width to have a predetermined width W2. The width W1 becomes equal to the gate length Lg1, and the width W2 becomes equal to the gate length Lg2, if any pattern conversion difference arises between the pattern of the gate electrode before the exposing and developing steps and that after the exposing and developing steps.

For example, a photo-resist of a positive type is used as a resist exposed to light by use of the phase-shifting mask and the trimming mask. With regard to the sequence to expose the resist to light, the light exposure using the phase-shifting mask shown in FIG. 3 is performed before the light exposure using the trimming mask shown in FIG. 4 is performed. The reason of the sequence is that the Levenson type phase-shifting mask as shown in FIG. 3 is formed in the fine dimensions so that the mask is required to be aligned to the resist with high precision. It should be noted that an ArF (argon fluoride) excimer laser with a wavelength (λ) of 193 nm is used for the exposure of the resist to light by use of the Levenson type phase-shifting mask formed by the above-described method. In addition, the light exposure dosage is set at an optimal value in order that the minimum width of the gate patterns with the dense pitches can be 65 nm, for example.

By using the resist patterns formed by the foregoing steps as a mask, a poly-silicon film, which is not illustrated here, is processed by RIE (Reactive Ion Etching). As a result, the gate electrodes and the gate interconnections are formed.

In the foregoing manufacturing method, the gates are processed after the dual light exposures and the development. The following sequence may be adopted. First, the interconnections are formed by processing a poly-silicon film after an exposure of the resist by use of the trimming mask and a development. Next, the gate electrodes are formed by processing the poly-silicon film after another exposure of the resist by use of the phase-shifting mask and development. In this case, the number of steps increases, but it is possible to prevent alignment slippage, in comparison with the case where a development is performed after dual light exposures are performed. Only insulating films formed on the poly-silicon film may be selectively removed in a first gate processing, before the gate electrode films formed on the poly-silicon film may be selectively removed by etching in a second gate processing.

Figure 6:
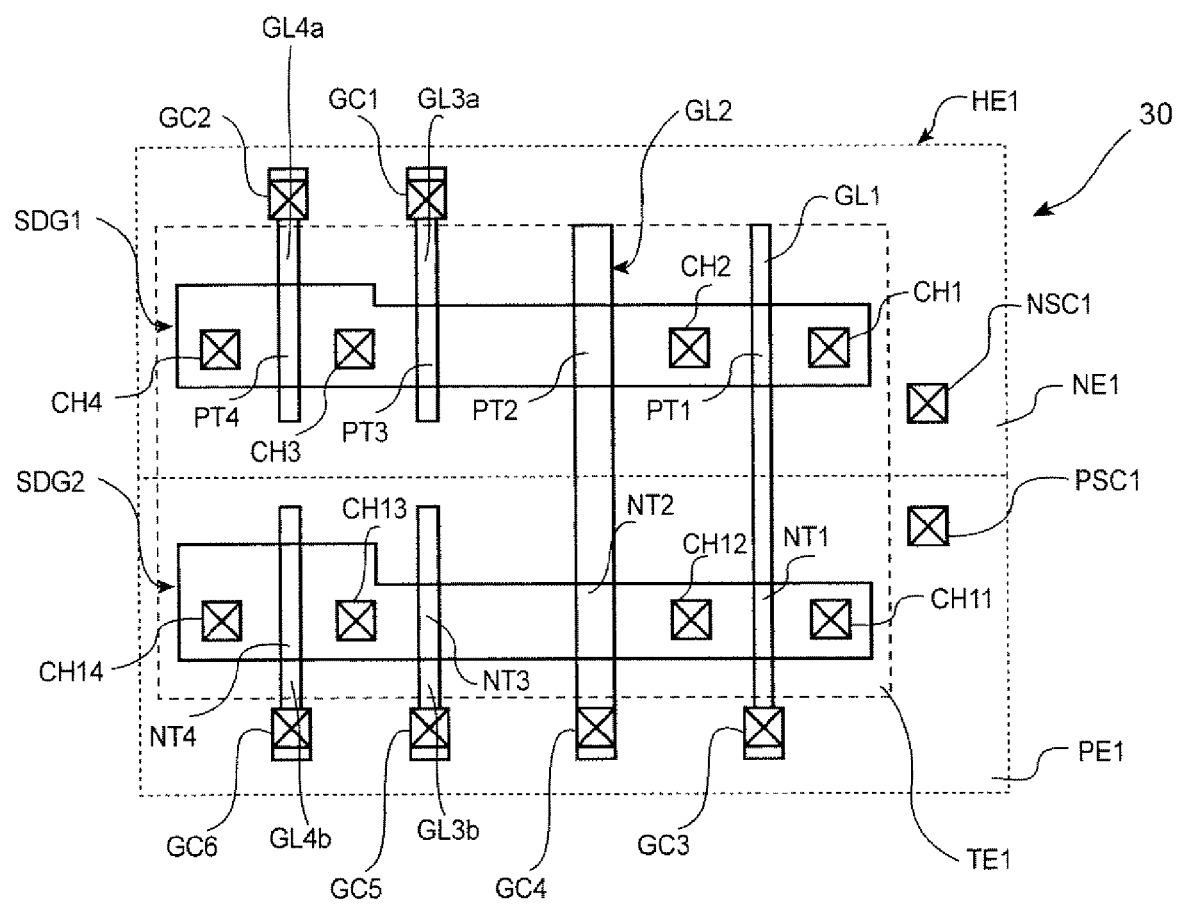
FIG. 6 is a diagram showing a layout of a latch feedback circuit to be obtained by use of a first embodiment of a method of manufacturing a semiconductor device including insulating gate-type transistors according to the invention.

An Arrangement of the integrated circuit patterns of the latch feedback circuit 10 shown in FIG. 2 will be explained, which is formed by the foregoing steps, with reference to FIG. 6. FIG. 6 is a diagram showing a layout 30 of the latch feedback circuit 10. FIG. 6 shows the layout of main patterns to be formed before contact portions are formed. The layout of interconnections and via contact portions is omitted from FIG. 6 which is to be formed after the contact portions are formed, In the case of the layout 30 of the latch feedback circuit 10 shown in FIG. 6, p-channel MOS transistors PT1 to PT4 are provided in a diffusion region SDG1 in an n-well area NE1. N-channel MOS transistors NT1 to NT4 are provided in a diffusion region SDG2 in a p-well area PE1.

Gate electrodes GL1, GL3a, GL3b, GL4a and GL4b are formed to have the minimum gate length Lg1, A gate electrode GL2 is formed to have the fine gate length Lg2 wider than the minimum gate length. The interconnection area of the n-well area NE1 is provided with a contact region NSC1. The contact region NSC1 is an n-well sub-contact. The interconnection area of the p-well area PE1 is provided with a contact region PSC1. The contact region PSC1 is a p-well sub-contact.

Contact regions GC1 to GC6 are provided in the interconnection area HE1. The contact regions GC1 to GC6 are respectively contacts of gate interconnections. Contact regions CH1 to CH4 are provided in the diffusion region SDG1. The contact regions CH1 to CH4 are respectively contacts of sources/drains of the transistors. Contact regions CH11 to CH14 are provided in the diffusion region SDG2. The contact regions CH11 to CH14 are respectively contacts of sources/drains of the transistors Here, the width of the lead-out interconnection portion of each of the gate electrode GL1, GL3a, GL3b, GL4a and GL4b is designed to be equal to the gate length Lg2 of each of the p-channel MOS transistor PT2 and the n-channel MOS transistor NT2. However, the width of the lead-out interconnection portion of each of the gate electrodes may be designed to be unequal to the gate length Lg2. The width of the lead-out interconnection portion of each of the gate electrode GL1, GL3a, GL3b, GL4a and GL4b may be designed to be, for example, longer than the gate length Lg2 of each of the p-channel MOS transistor PT2 and the n-channel MOS transistor NT2.

As described above, the photo-mask, the multiphase exposure method, and the method of manufacturing a semiconductor device including insulated gate-type transistors, according to the embodiments, bring about the following advantages. The arrangement of the embodiments may make it possible to use the mask area efficiently so that the arrangement may prevent increase in the layout area of the photo-mask. It is because only one phase shifter part or one non-phase shifter part may be arranged between two neighboring gate patterns.

Both the patterns of the minimum dimensional width and the patterns of the fine dimensional width slightly wider than the minimum dimensional width are present in the photo-mask at the same time. Accordingly, this mixture may make it possible to prevent increase in the layout area, even though some patterns formed with the dense pitches and other patterns formed with the sparse pitches are present in the photo-mask at the same time.

The present embodiment is an example of the application of the present invention to the latch feedback circuit. The latch feedback circuit supplies the output OUT to the memory circuit. Nevertheless, the present invention can be applied to gate circuits and sequence circuits which includes an MTC- MOS (Multi-threshold Complementary Metal Oxide Semiconductor) having multiple absolute values (|Vth|) of transistor threshold voltages. It should be noted that the present invention is applicable to NAND gates, inverters, AND gates, OR gates, NOR gates and the like as a gate circuit of the foregoing type. For example, using patterns of a narrower gate dimension (a shorter gate length Lg) for a high-speed transistor whose absolute values |Vth| are smaller, or using patterns of a wider gate dimension (a longer gate length Lg) for a low-speed transistor whose absolute values |Vth| are larger, and for a transistor on which a strict leakage current restriction is imposed. In addition, the present invention is applicable to, for example, flip-flops, registers, counters and the like as a sequence circuit of the forgoing type. In the case of the embodiment, the multiphase exposure method is used to form resist patterns for (multiple) gates. However the multiphase exposure method may be used to form resist patterns for diffusion regions and resist patterns for interconnections.

Figure 7:
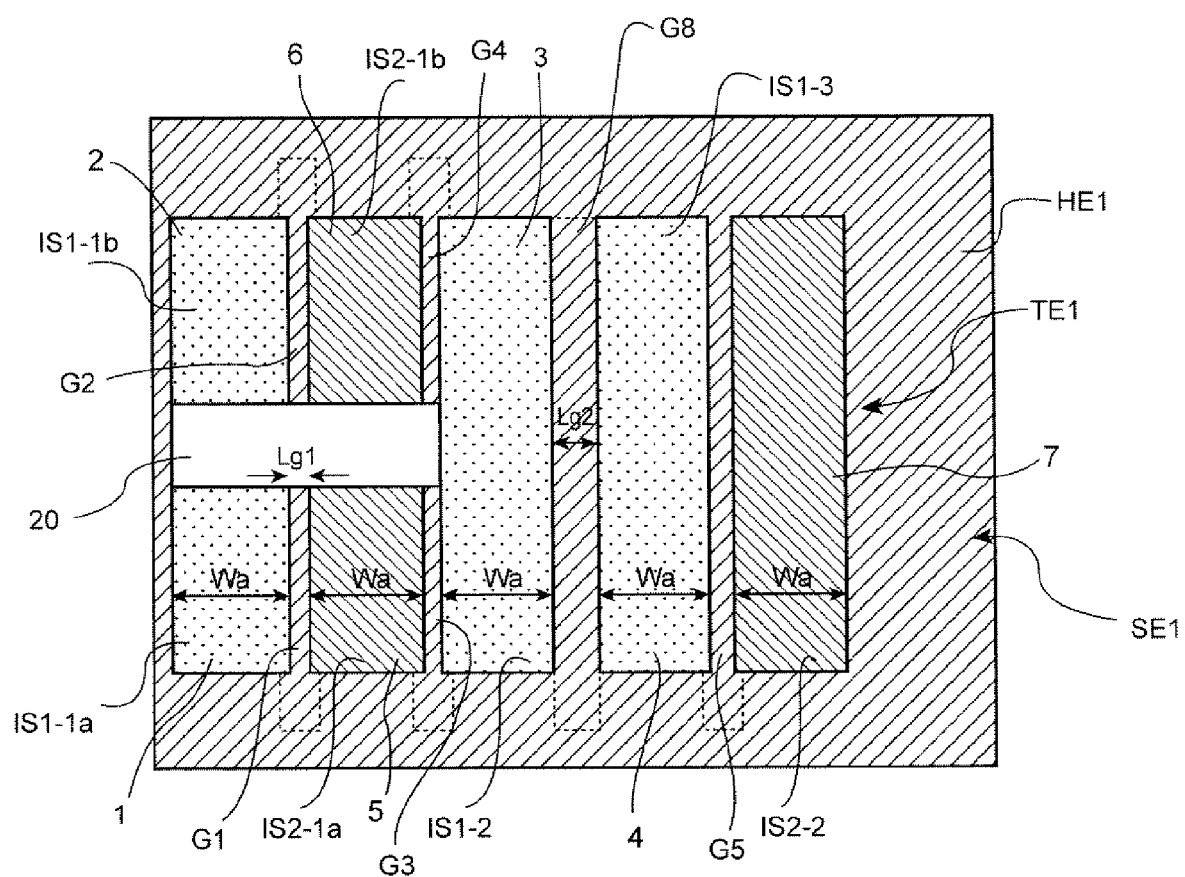
FIG. 7 is a plan view showing a second embodiment of a photo-mask according to the invention.
Figure 8:
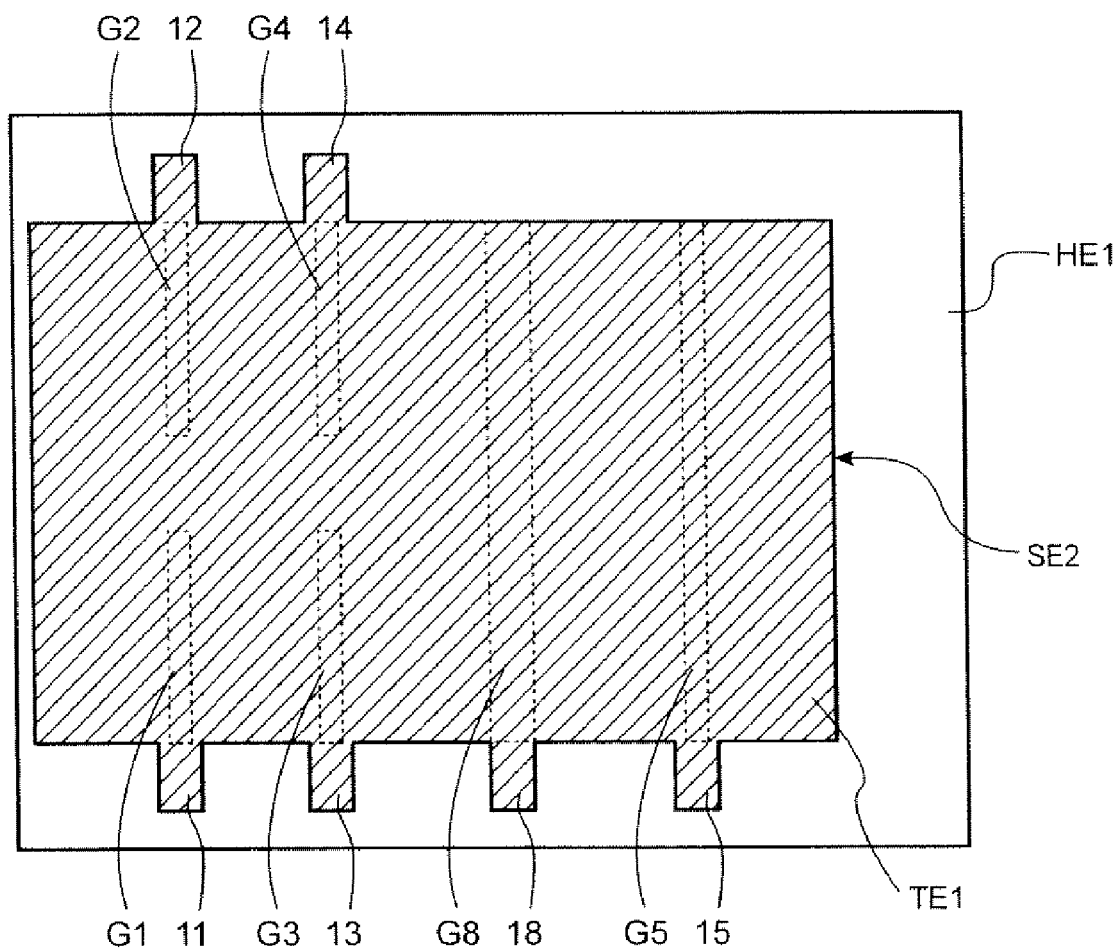
FIG. 8 is a plan view showing a gate trimming mask to be used for a second embodiment of the multiphase exposure method according to the invention.
Figure 9:
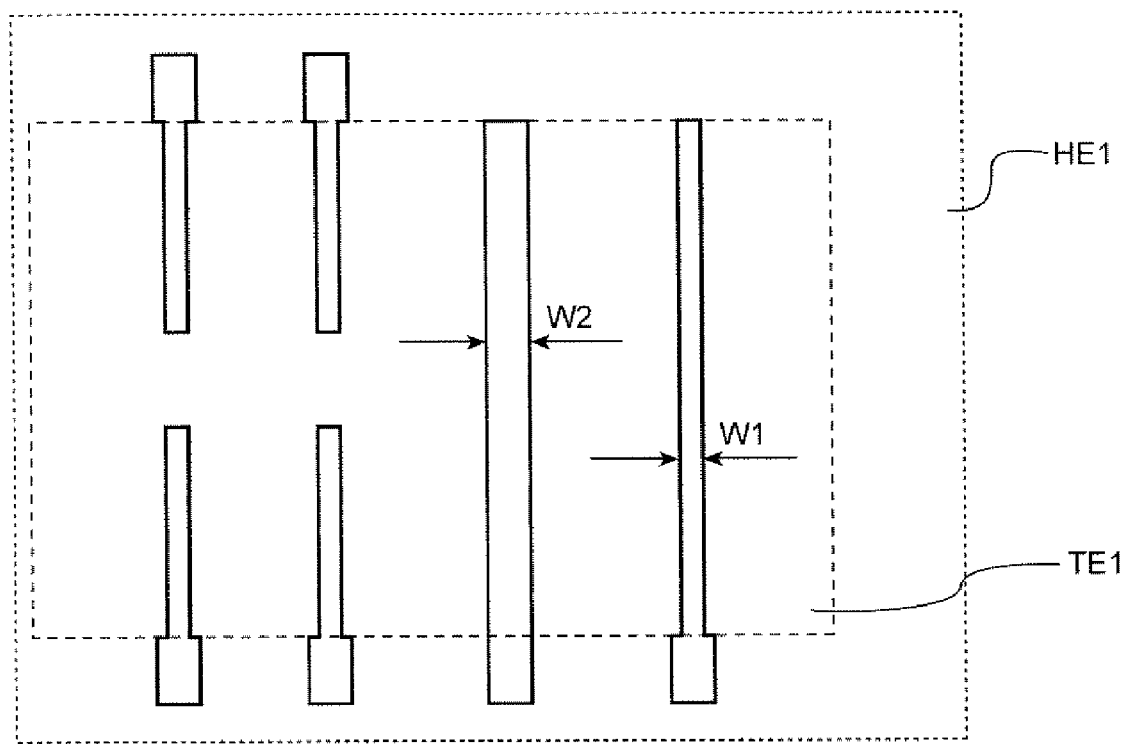
FIG. 9 is a plan view showing photo-resist patterns to be formed by use of the second embodiment of the multiphase exposure method according to the invention.

Second embodiments respectively of the photo-mask, the multiphase exposure method and the method of manufacturing a semiconductor device including insulating gate-type transistors will be explained with reference to the drawings. FIG. 7 is a plan view showing an embodiment of the phase-shifting mask to be used for manufacturing the latch feedback circuit. FIG. 8 is a plan view showing a gate trimming mask to be used for manufacturing the latch feedback circuit. FIG. 9 is a plan view showing photo-resist patterns for parts of the gate electrodes and parts of the corresponding gate interconnections in the latch feedback circuit. The embodiments are different from the first embodiments in the configurations respectively of the phase-shifting mask and the gate trimming mask to be used for forming gate patterns of the fine dimensional width wider than the minimum dimensional width.

In FIGS. 7 to 9 showing the second embodiments of the invention, components, which are the same as those of the first embodiment, are denoted by the same reference numerals respectively. The second embodiments will be explained below.

In the case of the photo-mask shown in FIG. 7, the lateral dimension of a transistor area TE11 is narrower than the lateral dimension of the transistor area TE1 according to the first embodiment by a length obtained by subtracting "the width Lg2 of a light shielding region G8" from "the width Lg of the light shielding region G6."

The gate patterns respectively of the light shielding regions G1 to G2 each with the minimum dimensional width, and the gate patterns respectively of the light shielding regions G3 to G4 each with minimum dimensional width, are arranged with uniform pitches. On the other hand, the gate pattern for the light shielding region G8 with the fine dimensional width wider than the minimum dimensional width.

As a result, all of the gate patterns are not arranged with the same pitches, and both parts formed with the dense pitches and parts formed with the sparse pitches are present in the photo-mask at the same time.

In the case of the trimming mask shown in FIG. 8, a light shielding area SE2 shields a transistor area TE1 from light. In addition, the interconnection portions of the respective gate layers serve as light shielding regions 11 to 15 and 18.

As shown in FIG. 9, a resist pattern corresponding to a gate electrode with the minimum dimensional width is formed with the predetermined dimensional width W1. A resist pattern corresponding to a gate electrode with the dimensional width wider than the minimum dimensional width is formed with the predetermined dimensional width W2. In this respect, the dimensional width W1 of the former resist pattern becomes equal to the gate length Lg1 whereas the dimensional width W2 of the latter resist pattern becomes equal to the gate length Lg2, if no difference takes place in the ratio of conversion from each of the patterns to its corresponding one of the gate electrodes in the exposing and developing steps.

Figure 10:
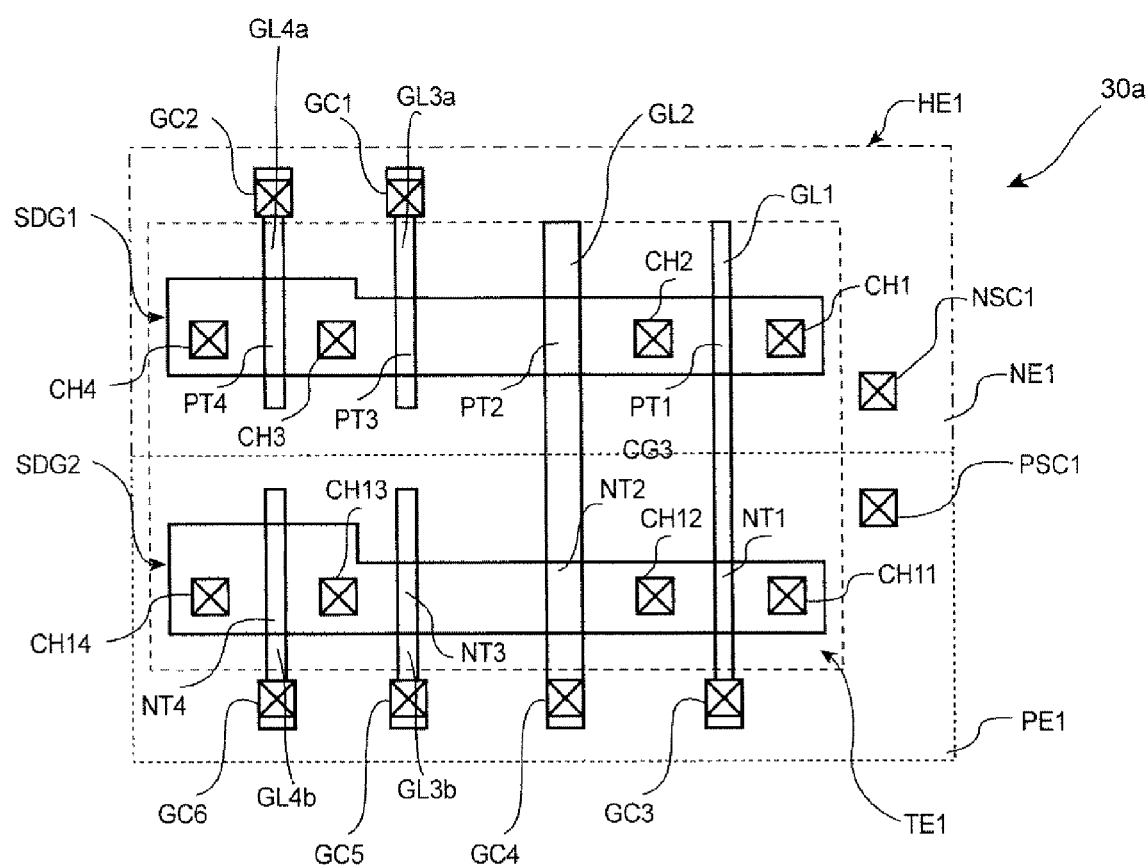
FIG. 10 is a diagram showing a layout of a latch feedback circuit to be obtained by use of a second embodiment of the method of manufacturing a semiconductor device including insulating gate-type transistors according to the invention.

An arrangement of integrated circuit patterns of the latch feedback circuits which are formed by use of the foregoing resist pattern, will be explained. FIG. 10 is a diagram showing a layout 30a of the latch feedback circuit. FIG. 10 shows the layout of main patterns to be formed before the step of forming the contact parts. The layout of interconnections and via contact parts, which are going to be formed after the contact parts are formed, is omitted from FIG. 10.

In the case of the layout 30a of the latch feedback circuit, as shown in FIG. 10, the lateral dimension of the n-well area NE1 is narrower than that of the n-well area NE1 according to the first embodiment. The difference between these two dimensions is obtained by subtracting the "gate length Lg2 of a gate formed by use of the light shielding region G8" from the "width Lg of the light shielding region G6." This diffusion region SDG1 is provided with the p-channel MOS transistors PT1 to PT4. The lateral dimension of the p-well area PE1 is narrower than that of the p-well area PE1 according to the first embodiment. The difference between these two dimensions is obtained by subtracting the "gate length Lg2" from the "width Lg of the light shielding region G6." This diffusion region SDG2 is provided with the n-channel MOS transistors NT1 to NT4.

The interval between the gate GL2 and each of the gates GL3a and GL3b is formed narrower than that between the gate GL2 and each of the gates GL3a and GL3b according to the first embodiment. The difference between these two intervals is a half of the difference obtained by subtracting the "the gate length Lg2" from the "width Lg." In addition, the interval between the gate GL1 and the gate GL2 is formed narrower than that between the gate GL1 and the gate GL2 according to the first embodiment. The difference between these two intervals is a half of the difference obtained by subtracting the "the gate length Lg2" from the "width Lg" as well. The interval between the gate GL2 and each of the contacts CH2 and CH12 is formed narrower than that between the gate GL2 and each of the contacts CH2 and CH12 according to the first embodiment.

As described above, the photo-mask, the multiphase exposure method, and the method of manufacturing a semiconductor device including insulating gate-type transistors, according to the present embodiments, bring about the following advantages.

Because a phase shifter part or a non-phase shifter part is arranged in the interstice between each two neighboring gate patterns, this arrangement may make it possible to use the mask area efficiently, and to accordingly prevent increase in the layout area of the photo-mask.

The lateral dimension of the transistor area TE1 according to the second embodiment of the present invention is narrower than that of the transistor area TE1 according to the first embodiment thereof. The difference between these two lateral dimensions is obtained by subtracting the "gate length LG2" from the "width Lg." This may make it possible to form the layout of the latch feedback circuit 10 in a smaller size.

Figure 11:
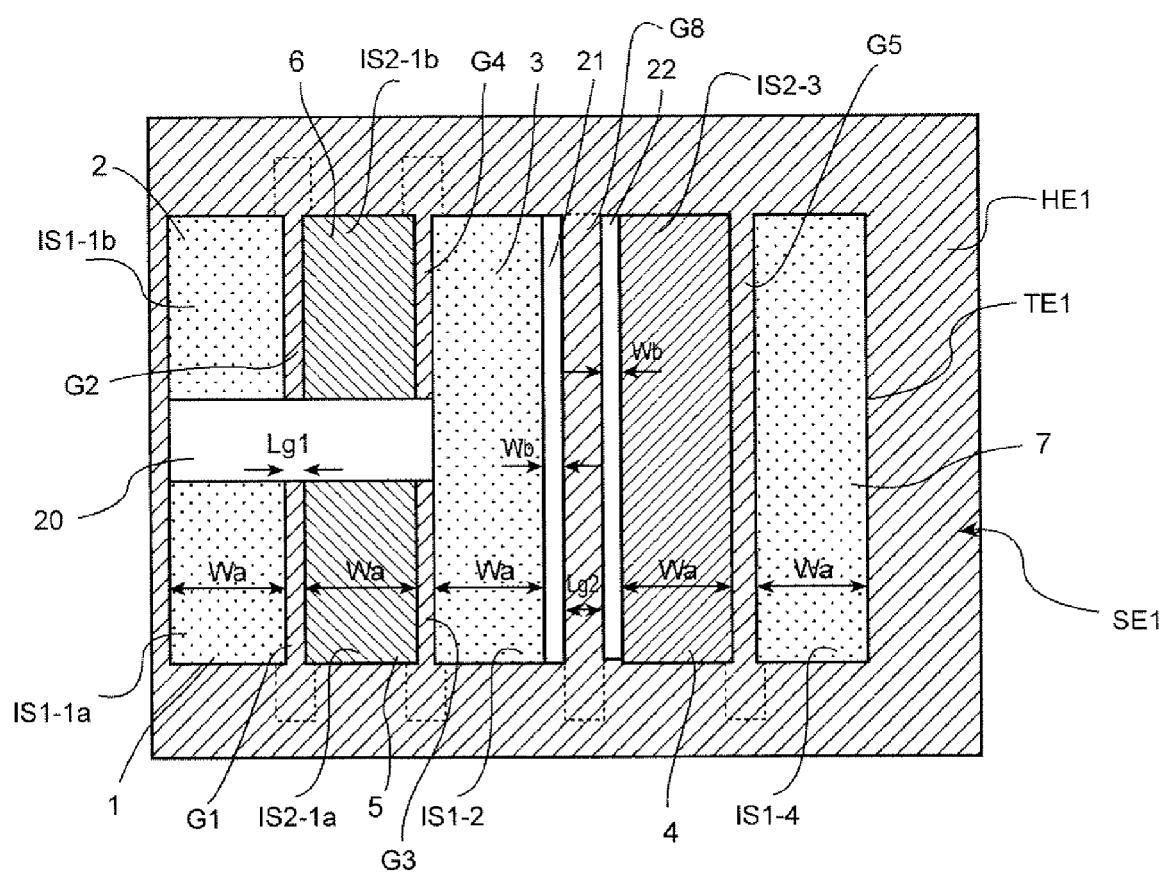
FIG. 11 is a plan view showing a third embodiment of the photo-mask according to the invention.
Figure 12:
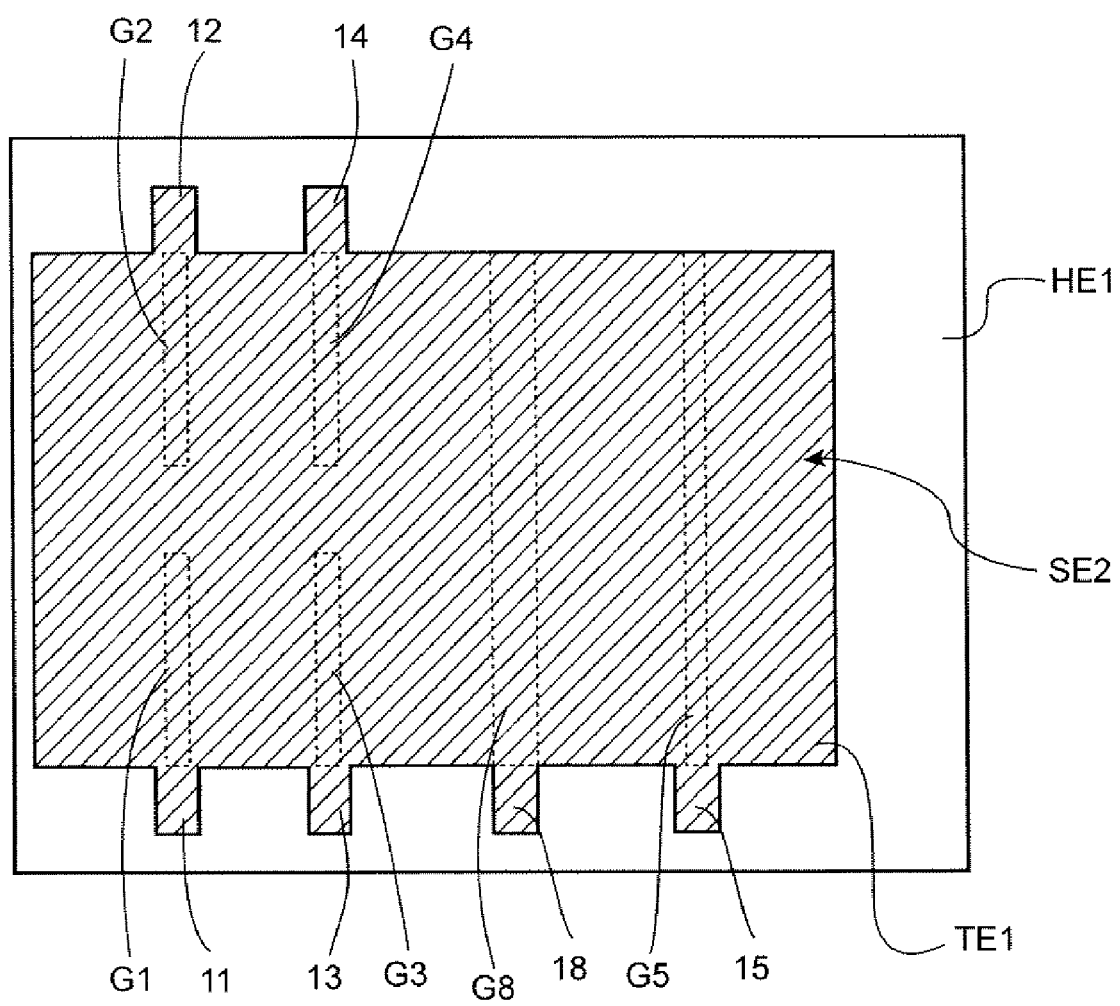
FIG. 12 is a plan view showing a trimming mask to be used for third embodiments of a multiphase exposure method and a method of manufacturing a semiconductor device including insulating gate-type transistors according to the invention.

Third embodiments respectively of the photo-mask, the multiphase exposure method and the method of manufacturing a semiconductor device including insulating gate-type transistors, according to the present invention, will be explained with reference to the drawings. FIG. 11 is a plan view showing a phase-shifting mask to be used for manufacturing a latch feedback circuit. FIG. 12 is a plan view showing a trimming mask to be used for manufacturing the latch feedback circuit. The embodiments are different from the first embodiments in the configuration of the photo-mask for forming gate patterns of the fine dimensional width wider than the minimum dimensional width.

In FIGS. 11 to 12 showing the third embodiments of the present invention, components which are the same as those of the first embodiments are denoted by the same reference numerals, and the detailed descriptions for the components will be omitted. The third embodiment is going to be explained below.

In the case of the phase-shifting mask used for manufacturing the latch feedback circuit 10, as shown in FIG. 11, light shielding regions G1 to G5 and G8, non-phase shifter parts IS1-1a, IS1-1b, IS1-2 and IS1-4, phase shifter parts IS2-1a, IS2-1b and IS2-3, a light transmitting region 20, and light transmitting regions 21 and 22 each with a width Wb, all of which are used for exposing the patterns for the respective gate electrodes, are arranged in a transistor area TE1. The light transmitting regions 20 to 22 are provided with no phase shifter part. A light shielding area SE1 is arranged in an interconnection area HE1 surrounding the transistor area TE1. Thereby, the interconnection portions (portions surrounded by broken lines in FIG. 11) of the respective gate layers are shielded from light.

A p-channel MOS transistor PT2 and an n-channel MOS transistor NT2 each with the fine dimensional width wider than the minimum dimensional width are formed by use of the light shielding region G8. The non-phase shifter part IS1-2 and the phase shifter part IS2-3 are arranged respectively at the two sides of the light shielding region G8 in a way that the two shifter parts IS1-2 and IS2-3 are separated away from the light shielding region G8 by the width Wb. Although, in this case, the non-phase shifter part IS1-2 and the phase shifter part IS2-3 are arranged respectively at the two sides of the light shielding region G8. Two non-phase shifter parts or two phase shifter parts may be instead arranged at the two sides of the light shielding region G8 respectively.

In the case of the trimming mask used, shown in FIG. 12, for manufacturing the latch feedback circuit 10, the transistor area TE1 is shielded from light by the light shielding area SE2. In addition, the interconnection portions 11 to 15 and 18 of the respective gate layers are shielded from light by the light shielding area SE2 as well.

As described above, a phase shifter part or a non-phase shifter part is arranged in the interstice between each two neighboring gate patterns. Thus, this arrangement may make it possible to use the mask area efficiently, and to accordingly check increase in the layout area of the photo-mask.

In the embodiments, the non-phase shifter part IS1-2, the phase shifter part IS2-3, and the light shielding region G8 for forming the corresponding gate electrode are arranged in the way that each of the non-phase shifter part IS1-2 and the phase shifter part IS2-3 is separated away from the light shielding region G8 by the width Wb. For this reason, the phase of light passing through an area contiguous to the light shielding region G8 need not be shifted. It is possible to make the light shielding region G8 of this kind correspond to the slightly wider gate length.

Figure 13:
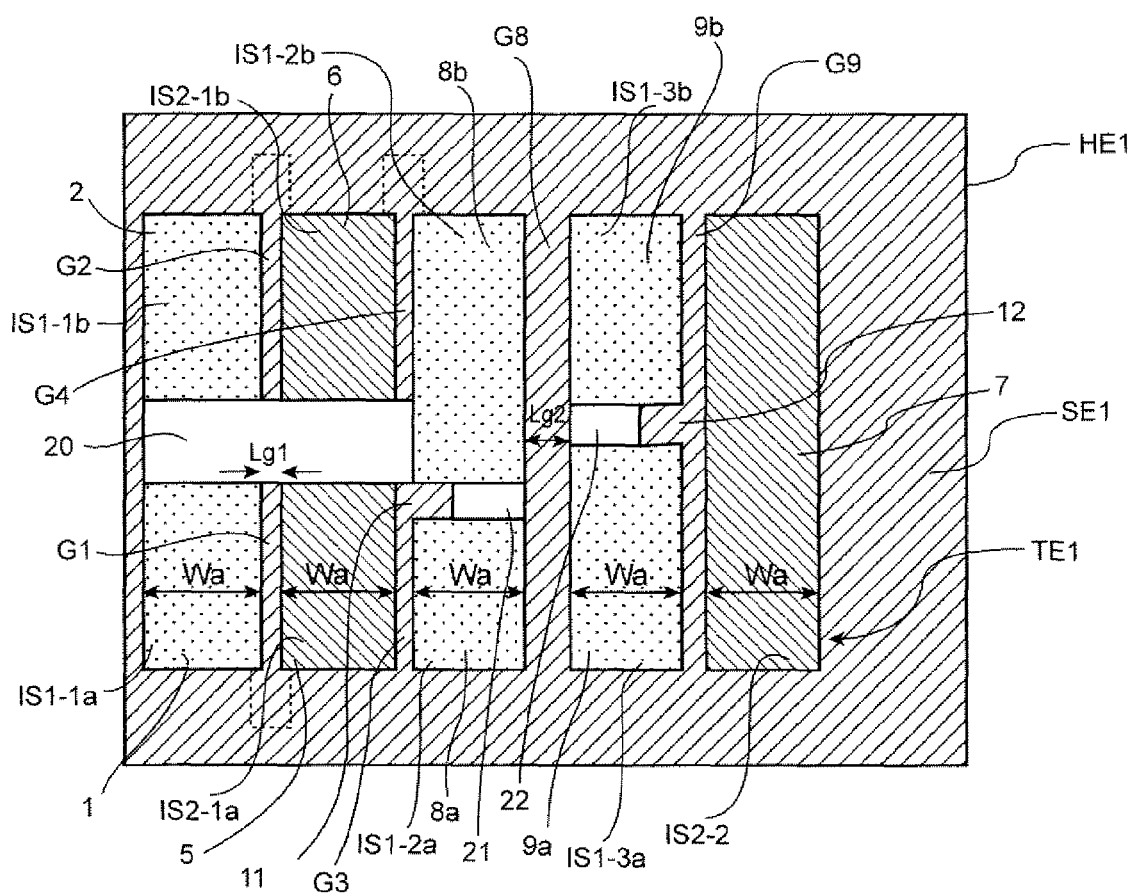
FIG. 13 is a plan view showing a fourth embodiment of the photo-mask according to the invention.

Fourth embodiments respectively of the photo-mask, the multiphase exposure method, and the method of manufacturing a semiconductor device including insulating gate-type transistors, according to the present invention, will be described with reference to the drawings. FIG. 13 is a plan view showing a phase-shifting mask to be used for manufacturing a latch feedback circuit. In FIG. 13, components which are the same as those of the first embodiment are denoted by the same reference numerals.

In the embodiments, the transistor area TE1 of the latch feedback circuit is provided with gate contacts. The fourth embodiments will be described below.

The embodiments are different from the first and second embodiments in that light shielding regions G3 and G9 are respectively provided with light shielding parts 11 and 12 each for forming a gate contact part. Light transmitting regions 21 and 22 which do not shift their respective phases of transmitted light are provided contiguous to the light shielding parts 11 and 12.

In the embodiments, the single non-phase shifter part IS1-2 which has been provided there in FIGS. 3 and 7 is divided into two phase shifter parts IS1-2a and IS1-2b. Neither a phase shifter part nor a light shielding part is arranged between the light shielding part 11 and the light shielding region G8. In addition, the single non-phase shifter part IS1-3 which has been provided there in FIGS. 3 and 7 is divided into two phase shifter parts IS1-2a and IS1-2b. Neither a phase shifter part nor a light shielding part is arranged between the light shielding part 12 and the light shielding region G8.

In the case of the trimming mask used for manufacturing the latch feedback circuit 10, the transistor area TE1 and parts encompassed by broken lines in FIG. 13 are the light shielding regions.

Figure 14:
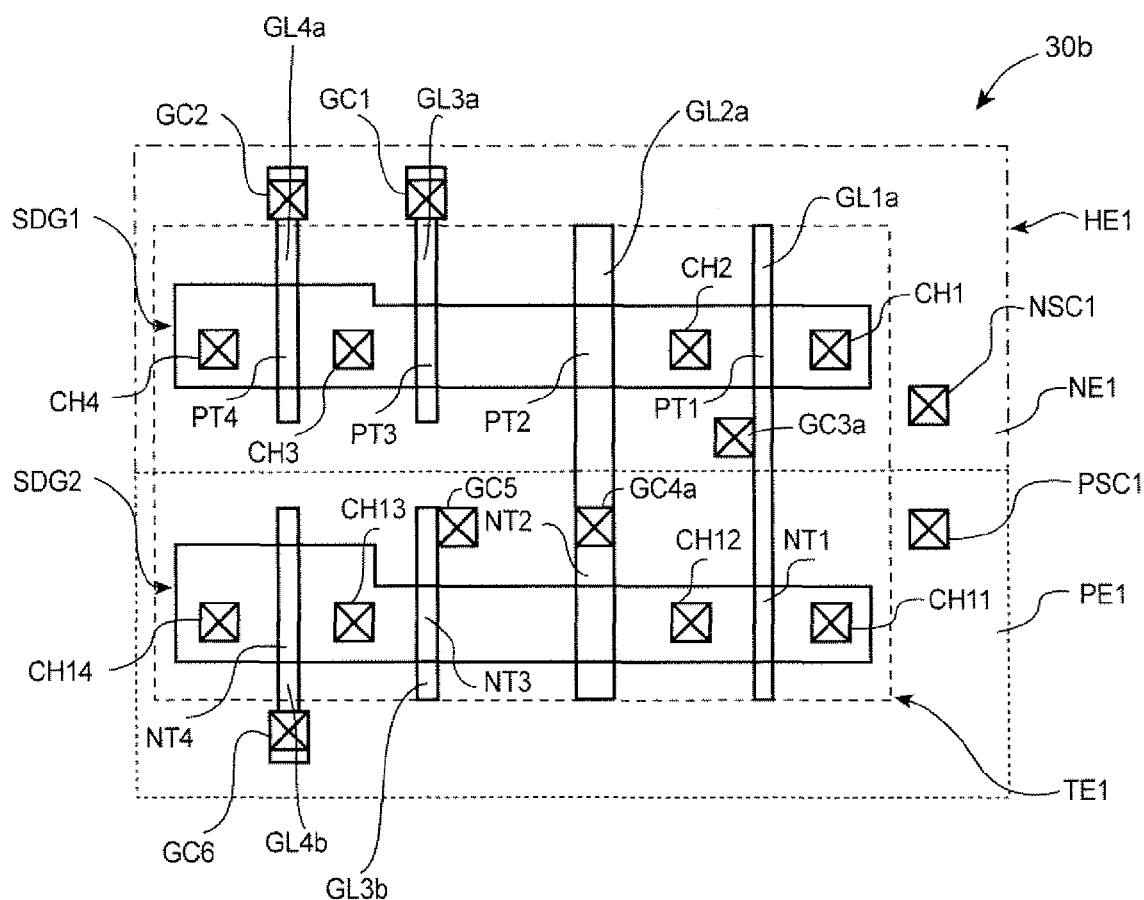
FIG. 14 is a diagram showing a layout of a latch feedback circuit to be obtained by fourth embodiments of a multiphase exposure method and a method of manufacturing a semiconductor device including insulating gate-type transistors according to the invention.

An arrangement of the patterns of the latch feedback circuit will be described with reference to FIG. 14. FIG. 14 is a diagram showing a layout 30b of the latch feed back circuit. FIG. 14 shows main patterns which are formed before the step of forming the contacts. The layout of patterns formed after the interconnections and the via contacts are formed is omitted from FIG. 14.

In FIG. 14, a gate contact part GC4a contacting the p-channel MOS transistor PT2 and the n-channel MOS transistor NT2 each with the fine dimensional width wider than the minimum dimensional width is provided to the layout. In addition, a gate contacts GC3a contacting the p-channel MOS transistor PT1 and a gate contact GC5 contacting the n-channel MOS transistor NT3 are provided to the layout.

In the case of the layout 30b of the latch feedback circuit, like the lateral dimensional width of the transistor area TE1 according to the second embodiment, the lateral dimensional width of the transistor area TE1 is capable of being formed narrower than that of the transistor area TE1 according to the first embodiment. The difference between these two dimensional widths is obtained by subtracting the "gate length Lg2" from the "width Lg." Accordingly, like the lateral dimensional width of the diffusion regions SDG1 and SDG2 according to the second embodiment, the lateral dimensional width of the diffusion regions SDG1 and SDG2 are capable of being formed narrower than that of the diffusion regions SDG1 and SDG2 according to the first embodiment. The difference between these two dimensional widths is obtained by subtracting the "gate length Lg2" from the "width Lg."

The interval between the gate GL2a and each of the gates GL3a and GL3b is formed narrower than that between the gate GL2a and each of the gates GL3a and GL3b according to the first embodiment. The difference between these two intervals is a half of the difference obtained by subtracting the "the gate length Lg2" from the "width Lg." In addition, the interval between the gate GL1a and the gate GL2a is formed narrower than that between the gate GL1a and the gate GL2a according to the first embodiment. The difference between these two intervals is a half of the difference obtained by subtracting the "the gate length Lg2" from the "width Lg" as well. The interval between the gate GL2a and each of contact parts CH2 and CH12 is formed narrower than that between the gate GL2 and each of contact parts CH2 and CH12 according to the first embodiment. The contact GC3a is provided to a field area in the n-well area NE1, whereas the contacts GC4a and GC5 are provided to a field area in the p-well area PE1.

In the embodiments, a phase shifter part or a non-phase shifter part is arranged in the interstice between each two neighboring gate patterns Thus, this arrangement may make it possible to use the mask area efficiently, and to accordingly check increase in the layout area of the photo-mask.

Like the first to third embodiments, the non-phase shifter parts and the phase shifter parts are rectangular in the present embodiment. For this reason, a light beam whose phase is shifted and a light beam whose phase is not shifted are offset in a well-balanced manner, in comparison with a case where the planes of some phase shifter parts undulate. Like the first to third embodiment, the present embodiment causes the gates to be processed with a better precision.

This point will be discussed by citing a comparative example of a phase-shifting mask in FIG. 15, while comparing the embodiments with this comparative example.

Figure 15:
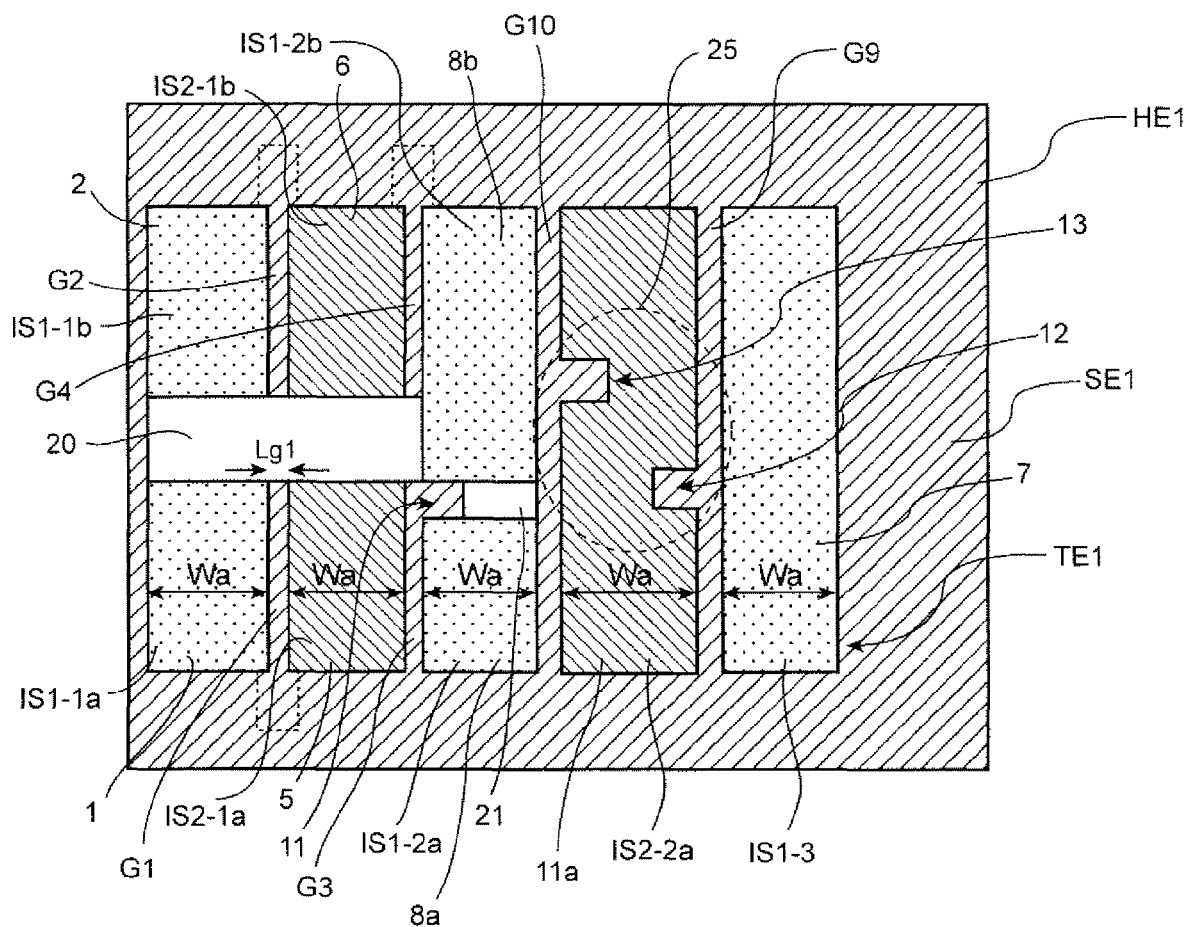
FIG. 15 is a plan view showing a comparative example of the photo-mask.

In the comparative example shown in FIG. 15, the light shielding regions G1 to G4, G9 and G10 for forming the respective gate patterns of the respective transistors are each formed with the minimum dimensional width.

Non-phase shifter parts IS1-1a, IS1-1b, IS1-2a, IS1-2b and IS1-3 as well as phase shifter parts IS2-1a, IS2-1b and IS2-2a are provided contiguous to the light shielding regions G1 to G4, G9 and G10 for the purpose of forming the gate patterns respectively for the transistors each with the minimum dimensional width. Light shielding parts 11 to 13 for forming the respective gate contact parts are formed in the transistor area TE1.

In this case, the phase shifter part IS2-2a existing in an area 25 provided with the light shielding parts 12 to 13 for forming the respective gate contact parts is not shaped like a square, and undulates in a direction in which the plane of the phase shifter part IS2-2a extends.

This makes the dimensional width of a portion of the phase shifter part, which portion is to the left of the light shielding part 12 in FIG. 15, and the dimensional width of a portion of the phase shifter part, which portion is to the right of the light shielding part 13 in FIG. 15, narrower than that of any other phase shifter parts. The resistor pattern for a gate including such portions makes the amount of a light beam passing through the left portion and the amount of a light beam passing through the right portion imbalanced. For this reason, no gate can be formed with the designed minimum dimensional width by use of this resist pattern.

Figure 16:
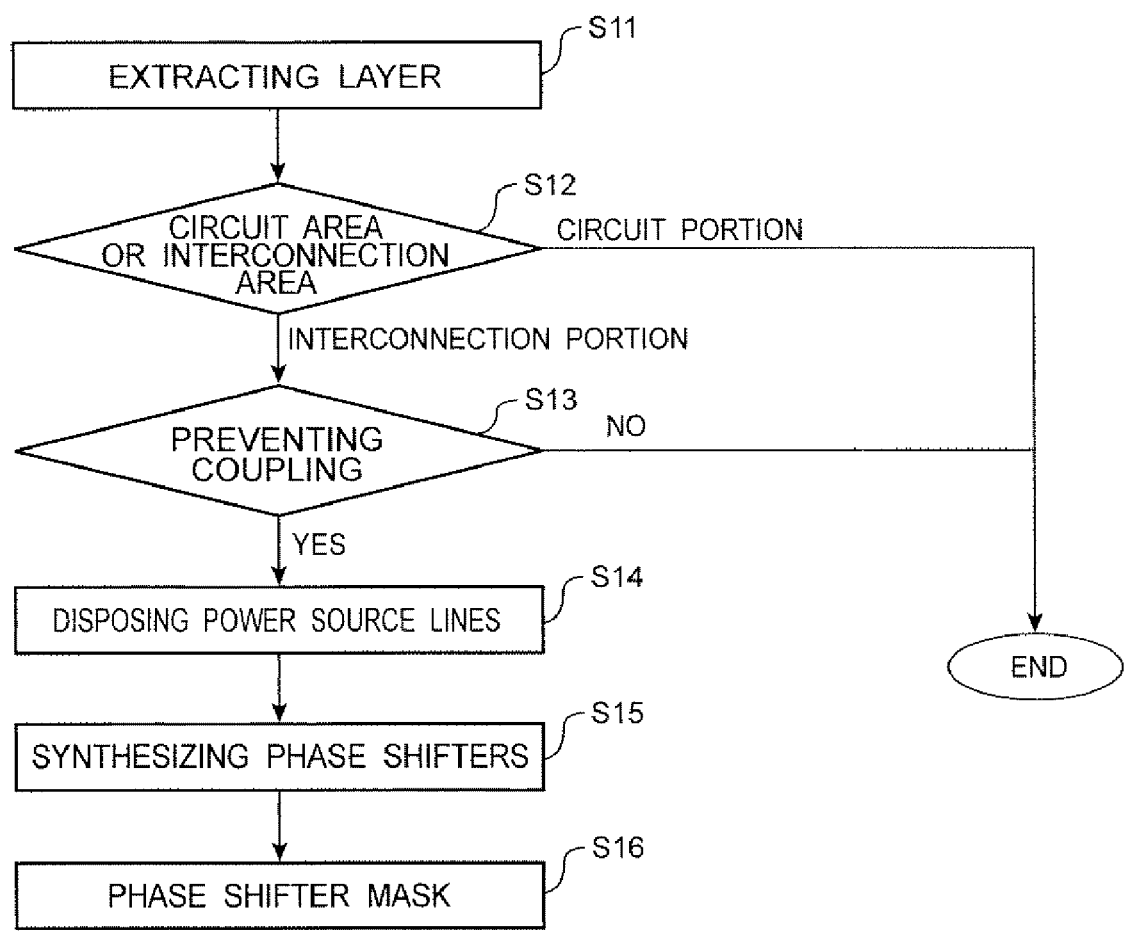
FIG. 16 is a flowchart showing another example of the method of designing a phase-shifting mask.
Figure 17:
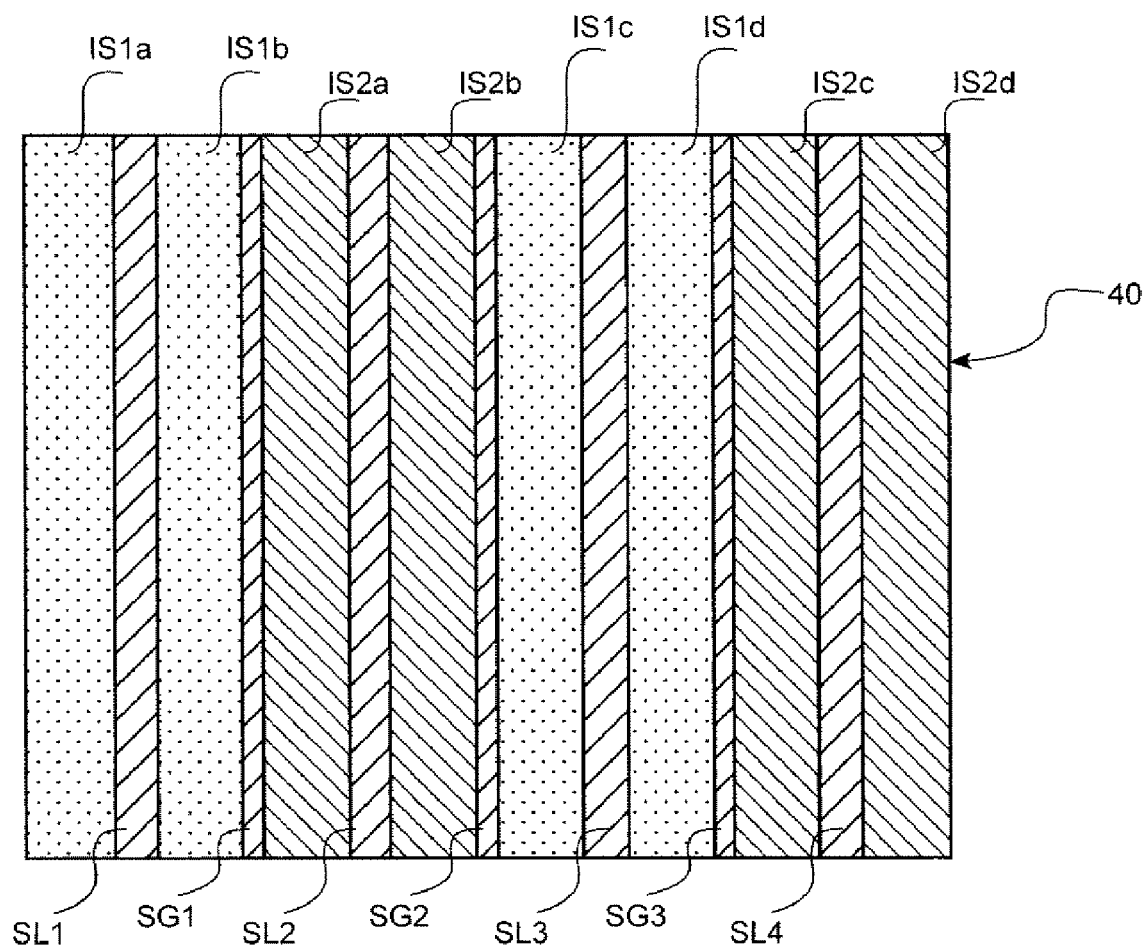
FIG. 17 is a plan view of a fifth embodiment of the photo-mask according to the invention.

Fifth embodiments respectively of the photo-mask, the multiphase exposure method, and the method of manufacturing a semiconductor device including insulated gate-type transistors, according to the present invention will be described with reference to the drawings. FIG. 16 is a flowchart showing how to design a phase-shifting mask for forming the interconnections. FIG. 17 is a plan view showing a fifth embodiment of the phase-shifting mask according to the present invention. In the embodiments, voltage supply interconnections are provided among (multiple) signal interconnections in the interconnection area.

In the case of a method of forming interconnections in an interconnection area in a system LSI circuit, as shown in FIG. 16, first of all, interconnection layers of the system LSI circuit are extracted (step S11). In this case, for example, interconnections in a first layer are extracted.

After the step, it is determined whether the interconnections in the first layer are provided to a circuit area or an interconnection area (step S12). In this respect, the circuit area means an area provided with active elements such as transistors and passive elements such as resistances. The interconnection area means an area provided with multiple signal interconnections with which circuit portions are electrically connected to one another, and with voltage supply interconnections for supplying power.

In a case where the interconnection area is selected, it is subsequently determined whether or not the signal interconnections in the interconnection area need a coupling prevention (step S13). In this respect, the coupling means electrical interaction which takes place among multiple interconnections through which to transmit signals, in a case where the multiple interconnections are arranged next to one another. Such an electrical interaction takes place in a case where, for example, intervals among bit lines in a memory circuit are narrower, or intervals among multiple high-speed signal interconnections are narrower. It should be noted that, in the case where the circuit area is selected in step S12, and in the case where the coupling prevention is unnecessary, the job for designing the phase-shifting mask is completed.

In a case where it is determined that the coupling prevention is necessary, newly, voltage supply interconnections are arranged among the signal interconnections (step S14). Because a predetermined electrical potential is applied to the voltage supply interconnections, these voltage supply interconnections function as shield interconnections for reducing interaction among signals transmitted through the signal interconnections next to one another.

On the two sides of each of the voltage supply interconnections, two non-phase shifter parts or two phase shifter parts are respectively. At the two sides of each of the signal interconnections, a non-phase shifter part and a phase shifter part are respectively arranged on the two sides of each of the signal interconnections. According to the arrangement, data on the non-phase shifter parts and phase shifter parts are synthesized (step S15). In this respect, the voltage supply interconnections are used as regular voltage supply lines. With this taken into consideration, the signal interconnections are formed with the minimum dimensional width, whereas the voltage supply interconnections are formed with the fine dimensional width wider than the minimum dimensional width.

The designing of the phase-shifting mask to be used for the dual exposure method is completed, when the synthesis of data on the existing phase shifter parts with data on the newly-arranged phase shifter part is completed (step S16).

FIG. 17 shows the phase-shifting mask which is designed through the foregoing steps. FIG. 17 shows a part corresponding to an interconnection area 40 in the system LSI circuit.

Signal interconnections SG1 to SG3 (signal interconnection patterns), voltage supply interconnections SL1 to SL4 (power supply interconnection patterns), non-phase shifter parts IS1a to IS1d, and phase shifter parts IS2a to IS2d are provided to the interconnection portion 40. The signal interconnections SG1 to SG3 are formed with the minimum dimensional width, whereas the voltage supply interconnections SL1 to SL4 are formed with the fine dimensional width wider than the minimum dimensional width.

The dimensional width, with which the voltage supply interconnections are formed, may be narrower than the dimensional width, with which the signal interconnections are formed. In this case, these voltage supply interconnections function as shield interconnections only. Two non-phase shifter parts are respectively arranged at the two sides of each of some voltage supply interconnections, whereas two phase shifter parts are respectively arranged at the two sides of each of the other voltage supply interconnections. A non-phase shifter part and a phase shifter part are respectively arranged at the two sides of each of the signal interconnections.

On the other hand, all of the interconnection portion 40 of the regular mask used for the dual exposure method serves as a light shielding portion. The foregoing descriptions have been provided for the dual exposure method which is applied to the formation of the interconnection patterns in the first layer. However, the dual exposure method is applicable to the formation of interconnection patterns in a second layer and any other layer.

One phase shifter part or one non-phase shifter part is arranged between each of the voltage supply interconnections SL1 to SL4 and its neighboring one of the signal interconnections SG1 to SG3. This arrangement makes it possible to use the mask area efficiently, and to prevent increase in the layout area of the photo-mask.

The present invention is not limited to the foregoing embodiments. The present invention may be modified in various ways without departing from the spirit or scope of the present invention.

Other embodiments or modifications of the present invention will be apparent to those skilled in the art from consideration of the specification and practice of the invention disclosed herein.

For example, the dual exposure method using one phase-shifting mask and one regular mask is used for each of the foregoing embodiments. However, the application of the present invention is not limited to these examples.

Multiphase exposure method, including a triple exposure method using two different phase-shifting masks and one regular mask, may be used for an embodiment for carrying out the invention.

In the above embodiments, the phase shifter parts and the non-phase shifter parts are arranged on both sides of the narrow and elongated light shielding regions respectively. The phase shifter parts and the non-phase shifter parts may be non-phase shifter parts and phase shifter parts respectively in reverse. In other words, combinations of "one (a first one) of a phase shifter part and a non-phase shifter part" and "the other one (a second one) of a phase shifter part and a non-phase shifter part" may be used in the invention.

It is intended that the specification and example embodiments be considered as exemplary only, with a true scope and spirit of the invention being indicated by the following.

What is claimed is:

1. A photo-mask comprising:
    a first light shielding region being narrow and elongated, the first light shielding region corresponding to a first circuit pattern and being for use in manufacturing the first circuit pattern;
    a second light shielding region being elongated and wider than the first light shielding region and being distant from the first light shielding region, the second light shielding region corresponding to or wider than a second circuit pattern and being for use in manufacturing the second circuit pattern;
    a first light transmitting region being arranged on a first side of the first light shielding region and being provided with a-first one of a first phase shifter part and a first non-phase shifter part, the first phase shifter part shifting the phase of a transmitted light by zero degrees and the first non-phase shifter part shifting the phase of the transmitted light by 180 degrees;
    a second light transmitting region being arranged between a second side of the first light shielding region and a first side of the second light shielding region, the second light transmitting region being provided with the other one of the first phase shifter part and the first non-phase shifter part; and
    a third light transmitting region being arranged on a second side of the second light shielding region and being provided with one of a second phase shifter part and a second non-phase shifter part which shifts the phase of the transmitted light by the same degree as that of the other one of the first phase shifter part and the first non-phase shifter part, the second phase shifter part shifting the phase of a transmitted light by zero degrees and the second non-phase shifter part shifting the phase of the transmitted light by 180 degrees.

2. The photo-mask according to claim 1, wherein the first and the second phase shifter parts and the first and the second non-phase shifter parts have a substantially same width.

3. The photo-mask according to claim 1, wherein the first and second light shielding regions constitute a pattern of a gate electrode of an insulated gate transistor except for a gate contact portion.

4. The photo-mask according to claim 1, further comprising:
    a third light shielding region with a width substantially equal to that of the first light shielding region; and
    a fourth light transmitting region being provided with the other of the second phase shifter part and the second non-phase shifter part,
    wherein the third light shielding region is sandwiched between the third light transmitting region and the fourth light transmitting region.

* * * * *